United States Patent
Bonwick et al.

(10) Patent No.: US 7,659,786 B2
(45) Date of Patent: Feb. 9, 2010

(54) RING OSCILLATOR

(75) Inventors: Paul Bonwick, Wiltshire (GB); Alan Marshall, Didcot (GB); Howard Sims, legal representative, Didcot (GB)

(73) Assignee: Panasonic Corporation, Osaka (JP)

( * ) Notice: Subject to any disclaimer, the term of this patent is extended or adjusted under 35 U.S.C. 154(b) by 40 days.

(21) Appl. No.: 12/043,368

(22) Filed: Mar. 6, 2008

(65) Prior Publication Data
US 2008/0309417 A1 Dec. 18, 2008

(30) Foreign Application Priority Data
Mar. 8, 2007 (EP) ................................. 07103801

(51) Int. Cl.
*H03K 3/03* (2006.01)
(52) U.S. Cl. ..................... 331/57; 327/161; 327/263
(58) Field of Classification Search ............... 331/57; 327/161, 263
See application file for complete search history.

(56) References Cited

U.S. PATENT DOCUMENTS

| | | | |
|---|---|---|---|
| 4,495,628 A | 1/1985 | Zasio | |
| 5,517,155 A * | 5/1996 | Yamauchi et al. | 331/1 A |
| 5,789,969 A * | 8/1998 | Davis et al. | 327/276 |
| 6,134,191 A | 10/2000 | Alfke | |
| 6,157,231 A * | 12/2000 | Wasson | 327/156 |
| 6,222,392 B1 * | 4/2001 | Guo et al. | 327/20 |
| 6,232,845 B1 * | 5/2001 | Kingsley et al. | 331/57 |
| 6,356,514 B1 | 3/2002 | Wells et al. | |
| 6,388,533 B2 * | 5/2002 | Swoboda | 331/57 |
| 6,466,520 B1 | 10/2002 | Speyer et al. | |
| 6,611,477 B1 * | 8/2003 | Speyer et al. | 368/113 |
| 6,867,613 B1 | 3/2005 | Bienek | |
| 7,119,570 B1 | 10/2006 | Chirania et al. | |
| 7,126,404 B1 * | 10/2006 | Rosen | 327/292 |
| 2005/0149777 A1 | 7/2005 | Yuan et al. | |
| 2005/0248415 A1 * | 11/2005 | Osvaldella | 331/57 |
| 2006/0055481 A1 | 3/2006 | Takahashi | |
| 2006/0109058 A1 * | 5/2006 | Keating | 331/1 A |
| 2008/0116964 A1 * | 5/2008 | Kernahan et al. | 327/538 |
| 2009/0051396 A1 * | 2/2009 | Shimamoto | 327/153 |

* cited by examiner

*Primary Examiner*—Arnold Kinkead
*Assistant Examiner*—Richard Tan
(74) *Attorney, Agent, or Firm*—Greenblum & Bernstein, P.L.C.

(57) ABSTRACT

A ring oscillator includes a first logic block having a first input connected to a specific point along a delay path, a first output and a second output, and a second logic block having a first input connected to the first output of the first logic block, a second input connected to the second output of the first logic block, a third input connected to the end of the delay path, and a first output connected to the beginning of the delay path. The first logic block is arranged to alternately switch its first output and second output from logical HIGH to logical LOW, and vice versa, every time a rising edge is input into its first input. The second logic block is arranged to alternately select its first input and its second input every time a rising edge is input into its third input.

10 Claims, 6 Drawing Sheets

RING OSCILLATOR

BACKGROUND OF THE INVENTION

The present invention relates to a ring oscillator which is capable of measuring rising and falling edge propagation delays independently.

Known ring oscillators are used for a wide variety of applications including timing and delay propagation. When using ring oscillators to measure propagation delays with a view to characterising a circuit's performance, it is desirable to measure rising edge propagation delays independently of falling edge propagation delays.

However, most known ring oscillator frequencies depend on the sum of rising and falling edge propagation delays. In most circuits, rising edge propagation delays will be different from falling edge propagation delays. If the measurement of propagation delay is based on the average of the rising edge propagation and the falling edge propagation, as in most known ring oscillators, information regarding single edge propagation is lost.

In order to overcome the above problems, some prior art circuits have been developed which measure edge specific propagation delay. However, in order for these devices to perform the abovementioned task, a pulse must be introduced at some point in the circuit in order to set the oscillation into motion. Accordingly, these circuits must be coupled to pulse generation circuits.

The generation of pulses is a complex electronic process which requires proportionally complex circuitry. Accordingly, pulse generation circuits can be relatively large and complex. This need to couple large and complex pulse generation circuits to single edge ring oscillators has had a prohibitive effect on the integration of delay measurement circuits into very small areas of silicon.

Furthermore, with the advent of re-configurable logic fabrics, there has been an increasing desire to permit the re-configuration of selected parts of a circuit into a propagation delay characterising circuit which can dynamically be reconfigured to measure the delay of several different paths in a circuit.

Accordingly, there is a clear need for a single edge detecting ring oscillator which does not require a pulse in order to begin oscillating and which can be manufactured or configured easily and in a very small area.

BRIEF SUMMARY OF THE INVENTION

In order to meet these needs, the present invention provides a ring oscillator which comprises:

a first logic block having a first input connected to a specific point along a delay path, a first output and a second output; and a second logic block having a first input connected to the first output of the first logic block, a second input connected to the second output of the first logic block, a third input connected to the end of the delay path and a first output connected to the beginning of the delay path, wherein:

the first logic block is arranged to, in use, alternately switch its first output and second output from logical HIGH to logical LOW, and vice versa, every time a rising edge is input into its first input; and the second logic block is arranged to, in use, alternately select its first input and its second input every time a rising edge is input into its third input, such that:

the pulse width of the signal output from the first output of the second logic block is indicative of the time necessary for one of a rising edge or a falling edge to propagate from the beginning of the delay path to the specific point along the delay path and the inverse pulse width of the signal output from the first output of the second logic block is indicative of the time necessary for the one of the rising edge or the falling edge respectively to propagate from specific point along the delay path to the end of the delay path.

Preferably, the first logic block further comprises a second input for enabling the operation of the circuit and a third input; and the second logic block further comprises a second output which is connected to the input of the third input of the first logic block and a fourth input.

Preferably, the first logic block comprises:

a first logic block D-type flip-flop, the first input of the first logic block being connected to the clock input of the first logic block D-type flip-flop, the third input of the logic block being connected to D input of the first logic block D-type flip-flop and the Q output of the first logic block D-type flip-flop being connected to the first output of the first logic block;

a two-input exclusive OR gate, the second input of the first logic block being connected to one input of the two-input exclusive OR gate, the Q output of the first logic block D-type flip-flop being connected to the other input of the two-input exclusive OR gate and the output of the exclusive OR gate being connected to the second output of the first logic block; and an inverter, the second input of the first logic block being connected to the input of the inverter and the Reset input of the first logic block D-type flip-flop being connected to the output of the inverter.

Preferably, the second logic block further comprises:

a second logic block D-type flip-flop, the D input of the second logic block D-type flip-flop being connected to the second input of the second logic block, the clock input of the second logic block D-type flip-flop being connected to the third input of the second logic block the SET input of the second logic block D-type flip-flop being connected to the output of the inverter; and a two-input multiplexer, the first input of the multiplexer being connected to the first input of the second logic block, the second input of the multiplexer being connected to the second input of the second logic block and the control input of the multiplexer being connected to the Q output of the second logic block D-type flip-flop.

The ring oscillator may further comprising:

a first inverter located between the first output of the second logic block and the beginning of the delay path;

a second inverter located between the specific point along the delay path and the first input of the first logic block; and a third inverter located between the end of the delay path and the third input of the second logic block, such that:

the inverse pulse width of the signal output from the first inverter is indicative of the time necessary for the other one of the rising edge or the falling edge to propagate from the beginning of the delay path to the specific point along the delay path and the pulse width of the signal output from the first inverter is indicative of the time necessary for the other one of the rising edge or the falling edge to propagate from the from the specific point along the delay path to the end of the delay path.

The ring oscillator may further comprise:

a first configurable bypasser that selectively bypasses the first inverter;

a second configurable bypasser that selectively bypasses the second inverter; and a third configurable bypasser that selectively bypasses the third inverter, wherein:

when the first, second and third configurable bypassers are configured to bypass the first, second and third inverters respectively, the pulse width of the signal input to the beginning end of the delay path is indicative of the time necessary for one of a rising edge or a falling edge to propagate from the beginning of the delay path to the specific point along the delay path and the inverse pulse width of the signal input into the beginning of the delay path is indicative of the time necessary for the one of the rising edge or the falling edge to propagate from specific point along the delay path to the end of the delay path; and when the first, second and third configurable bypassers are configured not to bypass the first, second and third inverter respectively, the inverse pulse width of the signal input into the beginning of the delay path is indicative of the time necessary for the other one of the rising edge or the falling edge to propagate from the beginning of the delay path to the specific point along the delay path and the pulse width of the signal input into the beginning of the delay path is indicative of the time necessary for the other one of the rising edge or the falling edge to propagate from the from the specific point along the delay path to the end of the delay path.

The present invention further provides a method of measuring the propagation delay of a rising edge through a specific path in an integrated circuit using the above ring oscillator, the method comprises the steps:

defining the delay path in an integrated circuit;

defining the specific point along the delay path such that the specific point is substantially in the centre of the delay path; and measuring the pulse width of a signal generated at the first output of the second logic block.

The present invention further provides a method of measuring the propagation delay of a falling edge through a specific path in an integrated circuit using the above ring oscillator, the method comprises the steps:

defining the delay path in an integrated circuit;

defining the specific point along the delay path such that the specific point is substantially in the centre of the delay path; and measuring the inverse of the pulse width of a signal generated at the first output of the second logic block.

The present invention further provides a method of measuring the propagation delay of a rising edge through a specific path in an integrated circuit using the above ring oscillator, the method comprises the steps:

defining the delay path in an integrated circuit;

defining the specific point along the delay path such that the specific point is substantially in the centre of the delay path;

configuring the first, second and third bypassers to bypass the first, second and third inverters respectively; and measuring the pulse width of a signal generated at the first output of the second logic block.

The present invention further comprises a method of measuring the propagation delay of a falling edge through a specific path in an integrated circuit using the above ring oscillator, the method comprising the steps:

defining the delay path in an integrated circuit;

defining the specific point along the delay path such that the specific point is substantially in the centre of the delay path;

configuring the first, second and third bypassers to not bypass the first, second and third inverters respectively; and measuring the inverse of the pulse width of a signal generated at the first output of the second logic block.

The present invention provides several advantages over the prior art. One of these advantages is that the device of the present invention does not rely of any form of complicated pulse generation circuitry in order to begin oscillating. Accordingly, the present invention is ideally suited to be implemented on semiconductor devices where space is limited. Moreover, because the present invention provides a simple circuit for characterising propagation delays, it is also ideally suited for use in re-configurable logic devices which require quickly re-configurable circuits having the ability to characterise a wide range of different data paths. Furthermore, the speed and simplicity with which re-configurable fabric can be configured to implement the present invention is a distinct advantage in terms of the flexibility of self-characterising/monitoring circuits. Also, the ring oscillator of the present invention oscillates at a frequency determined solely by the delay of either a rising edge or a falling edge along the path under test. This provides significant advantages in terms of producing consistent propagation measurements in different circuits.

An example of the present invention will now be described with reference to the accompanying drawings, in which:

DETAILED DESCRIPTION OF THE INVENTION

Figure 1:
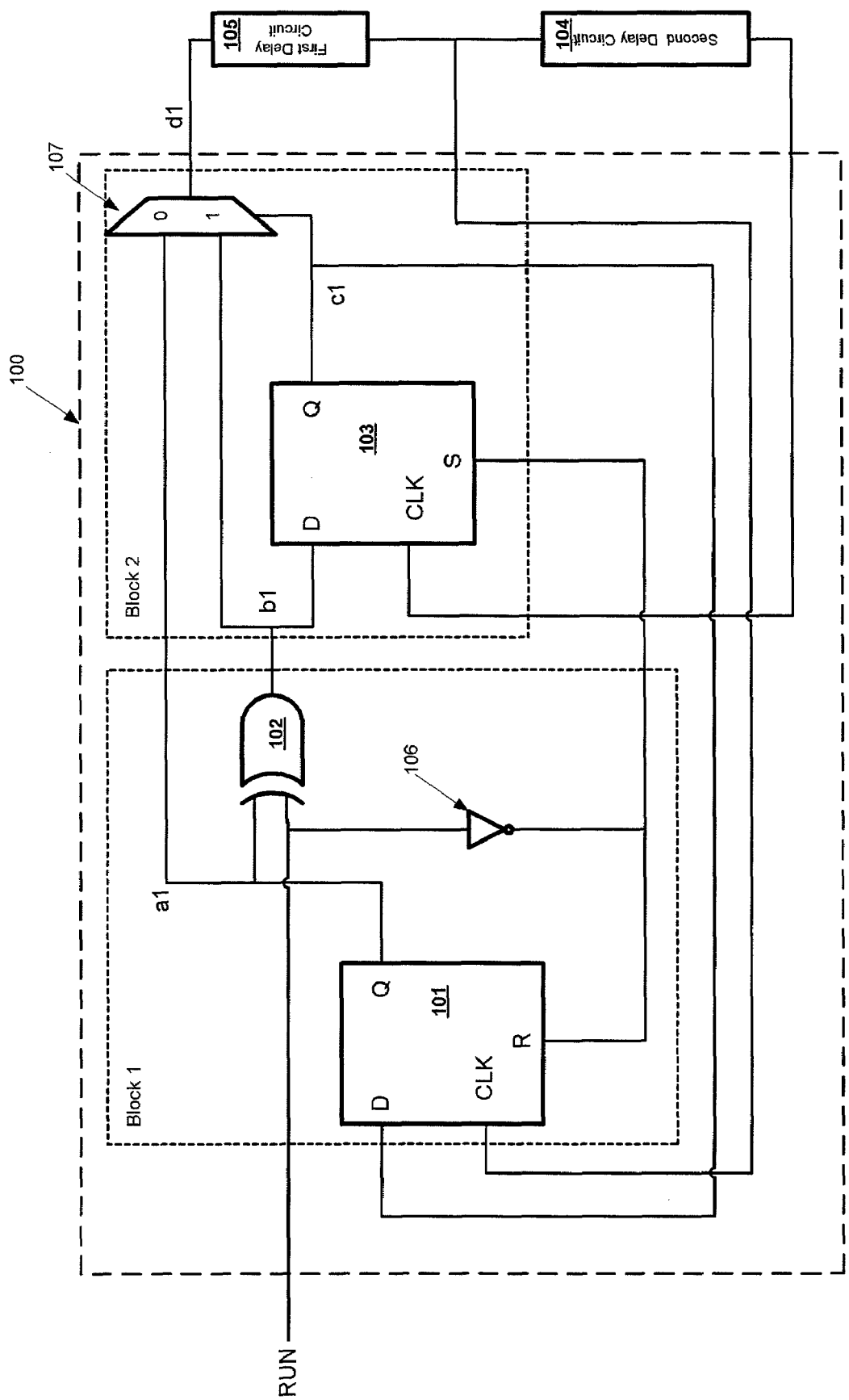
FIG. 1 is a schematic diagram of a circuit in accordance with a first example of the present invention.

With reference to FIG. 1, a first example of the present invention will now be described. The circuit 100 of the first example of the present invention comprises a first flip-flop 101 a second flip-flop 103, a two input exclusive-OR gate (XOR gate) 102 an inverter 106 and a two input multiplexer 107. In this first example, the only input signal of the circuit is the RUN signal.

The RUN signal is input into the first input of the XOR gate 102 as well as the input of the inverter 106. The output of the inverter 106 is connected to both the RESET input of the first flip-flop 101 and the SET input of the second flip-flop 103. The Q output of the first flip-flop 101 is connected to the second input of the XOR gate 102 as well as to the first input of the multiplexer 107. The output of the XOR gate 102 is connected to the second input of the multiplexer 107 as well as to the DELAY (D) input of the second flip-flop 103. The output of the second flip-flop 103 is connected to the control input of the multiplexer 107 and also to the D input of the first flip-flop 101. Thus, the output of the second flip-flop 103 will control the selection of the first and second inputs of the multiplexer. In this example, when the output of the second flip-flop 103 is LOW, the first input of the multiplexer 107 will be selected and passed to the output. Conversely, when the output of the second flip-flop 103 is HIGH, the second input of the multiplexer 107 will be selected and passed to the output.

The output of the multiplexer 107 is connected to the beginning of a first delay circuit 105. The end of the first delay circuit 105 is connected to both the input CLOCK signal of the first flip-flop 101 and to the beginning of a second delay circuit 104. The end of the second delay circuit 104 is connected to the CLOCK input of the second flip-flop 103.

Typically, the first delay circuit and the second delay circuit will both be part of the same logic path, routing path or delay path, the first delay being merely a tap part way along the total path. Preferably, the end point of the first delay circuit 104 is merely tapped approximately halfway between the start of the first delay circuit 104 and the end of the second delay circuit 105 (i.e. approximately at the centre of the entire delay circuit).

As can be seen from FIG. 1, the components of the present invention can be grouped into two distinct processing blocks. The first block comprises the first flip-flop 101, the XOR gate 102 and the inverter 106. The second block comprises the second flip-flop 103 and the multiplexer 107.

Now, with reference to both FIGS. 1 and 2, the operation of the first example of the present invention will now be described. Before the oscillator is set into oscillation mode, the RUN signal (or input signal) is set LOW. This causes the output of the inverter 106 to be set to HIGH and consequently the RESET input of the first flip-flop 101 to be HIGH and the SET input of the second flip-flop 103 to be HIGH.

Figure 2:
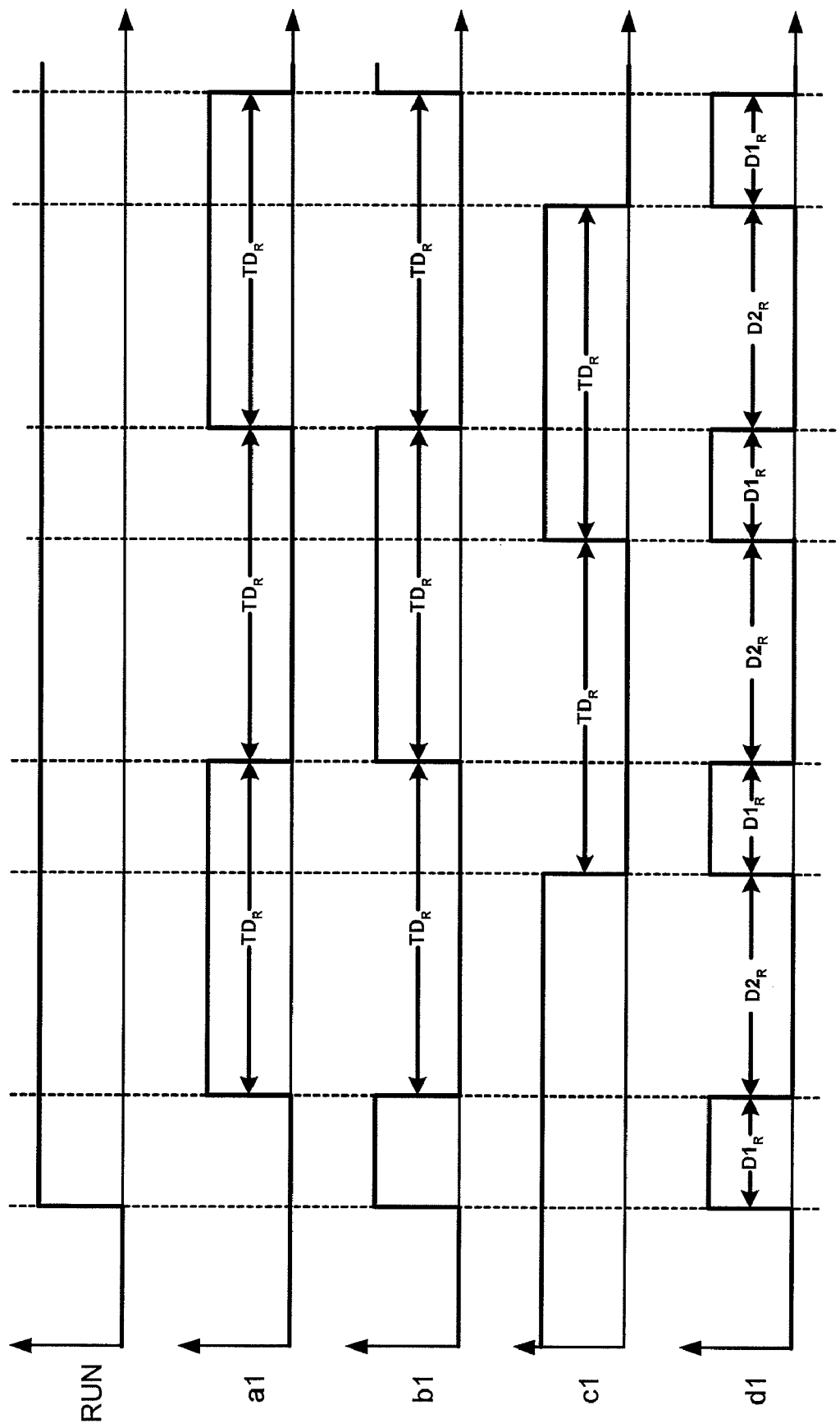
FIG. 2 is a timing diagram relating to the operation of the circuit of FIG. 1.

This will in turn cause the output signal of the first flip-flop 101 (i.e. signal "a1") to be set to LOW and the output signal of the second flip-flop 103 (i.e. signal "c1") to be set to HIGH, as is shown in FIG. 2. Because signal "a1" is set LOW and the RUN signal is set to LOW, the output of the XOR gate 102 will also be set to LOW. Moreover, because signal "c1" is set to HIGH, the multiplexer 107 will pass on its second input (signal "b1") and therefore signal "d1" will be set LOW.

When the RUN signal is set to HIGH, the first input of the XOR gate 102 will be set to HIGH and therefore the output of the XOR gate 102 (signal "b1") will also be set to HIGH, causing the output of the multiplexer 107 (signal "d1") to also go HIGH, thereby creating a rising edge.

This rising edge will propagate through the first delay circuit 105 until it reaches the CLOCK input of the first flip-flop 101. At this point, the signal on the D input of the first flip-flop 101 will be transferred from the input of the first flip-flop 101 through to the Q output of the first flip-flop 101, thereby causing signal "a1" to go from LOW to HIGH. Thus, at this point, both inputs of the XOR gate 102 will be set to HIGH and therefore the output of the XOR gate (signal "b1") will be switched to LOW. This will cause the second input of the multiplexer 107 to be switched to LOW and therefore the output of the multiplexer 107 (signal "d1") to be switched to LOW. This state will then be maintained until the rising edge has finished propagating through the second delay circuit 104.

When the rising edge reaches the end of the second delay circuit 104, it will arrive at the CLOCK input of the second flip-flop 103 and the D input of the second flip-flop 103 will be sent to the Q output of the second flip-flop 103, thereby setting signal "c1" to LOW. This will switch the active input of the multiplexer 107 and will also set the input of the first flip-flop 101 to LOW. Because the active input of multiplexer 107 is switched from the second to the first input, and the first input (signal "a1") is set to HIGH, the output of the multiplexer 107 will be set to HIGH, thereby creating a rising edge which will propagate through both the first delay circuit 105 and the second delay circuit 104.

Again, this state will be maintained until the rising edge has propagated through the first delay circuit 105 and reaches the CLOCK input of the first flip-flop 101, thereby transferring the input of the first flip-flop 101 (signal "c1") to the output of the first flip-flop 101 (signal "a1"). Thus, signal "a1" will be set to LOW and signal "b1" will be set to HIGH. This will lead to signal "d1" being set to LOW.

Once the rising edge of signal "d1" propagates through the second delay circuit 104, it reaches the CLOCK input of the second flip-flop 103. At this point, the D input of second flip-flop 103 will be transferred to its Q output and, consequently, signal "c1" will be set HIGH, which in turn will set signal "d1" to HIGH as well. This will again send a rising edge through the first delay circuit 105 until it reaches the CLOCK input of the first flip-flop 101 and transfers the D input of the first flip-flop 101 to its Q output. This will cause signal "b1" to be set to LOW and signal "a1" to be set to HIGH.

Then, when the rising edge of signal "d1" propagates through the second delay circuit and reaches the CLOCK input of the second flip-flop 103, it will set signal "c1" to LOW and signal "d1" to HIGH. The above cycle will be repeated until the RUN signal is set back to LOW. Accordingly, the oscillator circuit will continue to oscillate until it is switched off (i.e. by setting the RUN signal to LOW).

As can be seen from FIG. 2, the delay (D1R) related to the propagation of the rising edge through the first delay circuit 105 can be found by measuring the pulse width of signal "d1" and the propagation delay (D2R) of the rising edge through the second delay circuit 104 can be found by measuring the inverse pulse width of signal "d1". Also, the total propagation (TDR) of the rising edge through both the first delay and the second delay can be found by dividing the period of any one of signals "a1", "b1" or "c1" by 2, once the circuit has reached a steady state.

As can also be seen from FIG. 2, if D1R is too small, it may not propagate along the delay chain as a defined pulse. In other words, if the positive edge propagation is faster than the negative edge propagation, the pulse would get narrower as it propagated along the delay and could disappear before the end. Similarly, D2R shouldn't be too small. Thus, it is preferable that D1R and D2R be approximately the same. It is for this reason that, as mentioned above, the end point of the first delay circuit 104 is preferably tapped approximately halfway between the start of the first delay circuit 104 and the end of the second delay circuit 105 (i.e. approximately at the centre of the entire delay circuit).

Figure 3:
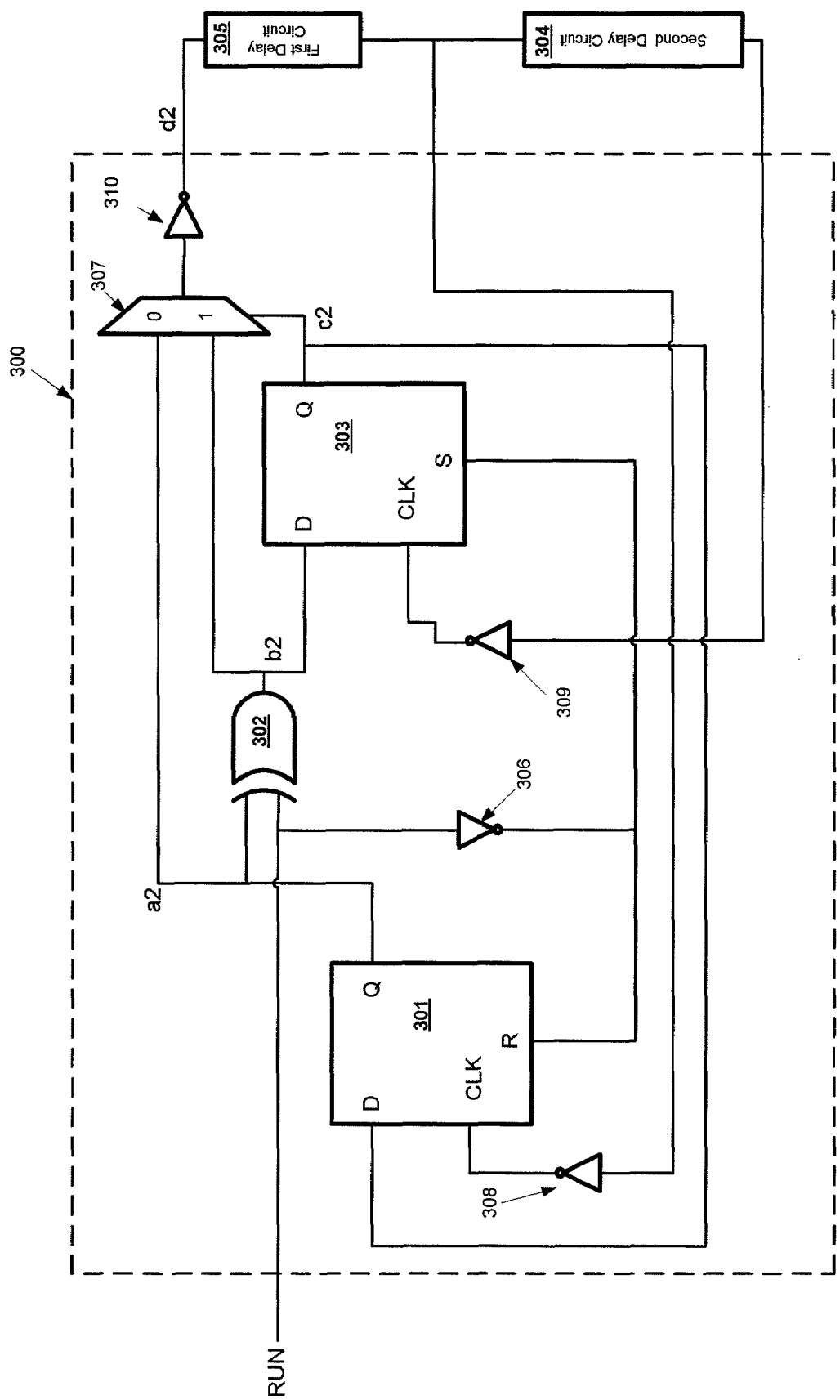
FIG. 3 is a schematic diagram of a circuit in accordance with a second example of the present invention.

The first embodiment of the present invention can be modified in order to measure the propagation delay of a falling edge. This can be done by replacing flip-flops 101 and 103 by flip-flops which are triggered by falling edges. Alternatively, this can be done by inserting an inverter after the multiplexer 107 and before both the CLOCK input of the first flip-flop 101 and the CLOCK input of the second flip-flop 103. Now, with reference to FIG. 3, this second example of the present invention will now be described.

The circuit 300 of the second example of the present invention comprises a first flip-flop 301 a second flip-flop 303, a two-input exclusive-OR gate (XOR gate) 302, four inverters 306, 308, 309 and 310 and a two-input multiplexer 307. In this second example, the only input signal of the circuit is the RUN signal.

The RUN signal is input into the first input of the XOR gate as well as the input of the inverter 306. The output of the inverter is connected to both the RESET input of the first flip-flop 301 and the SET input of the second flip-flop 303. The Q output of the first flip-flop 301 is connected to the second input of the XOR gate 302 as well as to the first input of the multiplexer 307. The output of the XOR gate 302 is connected to the second input of the multiplexer 307 as well as to the DELAY (D) input of the second flip-flop 303. The output of the second flip-flop 303 is connected to the control input of the multiplexer 307 and also to the D input of the first flip-flop 301. Thus, the output of the second flip-flop 303 will control the selection of the first and second inputs of the multiplexer. In this example, when the output of the second flip-flop 303 is LOW, the first input of the multiplexer 307 will be selected and passed to the output. Conversely, when the output of the second flip-flop 303 is HIGH, the second input of the multiplexer 307 will be selected and passed to the output.

The output of the multiplexer 307 is connected to the input of an inverter 310. The output of the inverter 310 is connected to the beginning of a first delay circuit 305. The end of the first delay circuit 305 is connected to the input of inverter 308. The output of inverter 308 is connected to both the input CLOCK signal of the first flip-flop 301 and to the beginning of a second delay circuit 304. The end of the second delay circuit 304 is connected to the input of inverter 309. The output of inverter 309 is connected to the CLOCK input of the second flip-flop 303.

As was the case in the first example of the present invention, the first delay circuit 305 and the second delay circuit 304 will typically both be part of the same logic path, routing path or delay path, the first delay being merely a tap part way along the total path.

Before the oscillator is set into oscillation mode, the RUN signal (or input signal) is set LOW. This causes the output of the inverter 306 to be set to HIGH and consequently the RESET input of the first flip-flop 301 to be HIGH and the SET input of the second flip-flop 303 to be HIGH.

Figure 4:
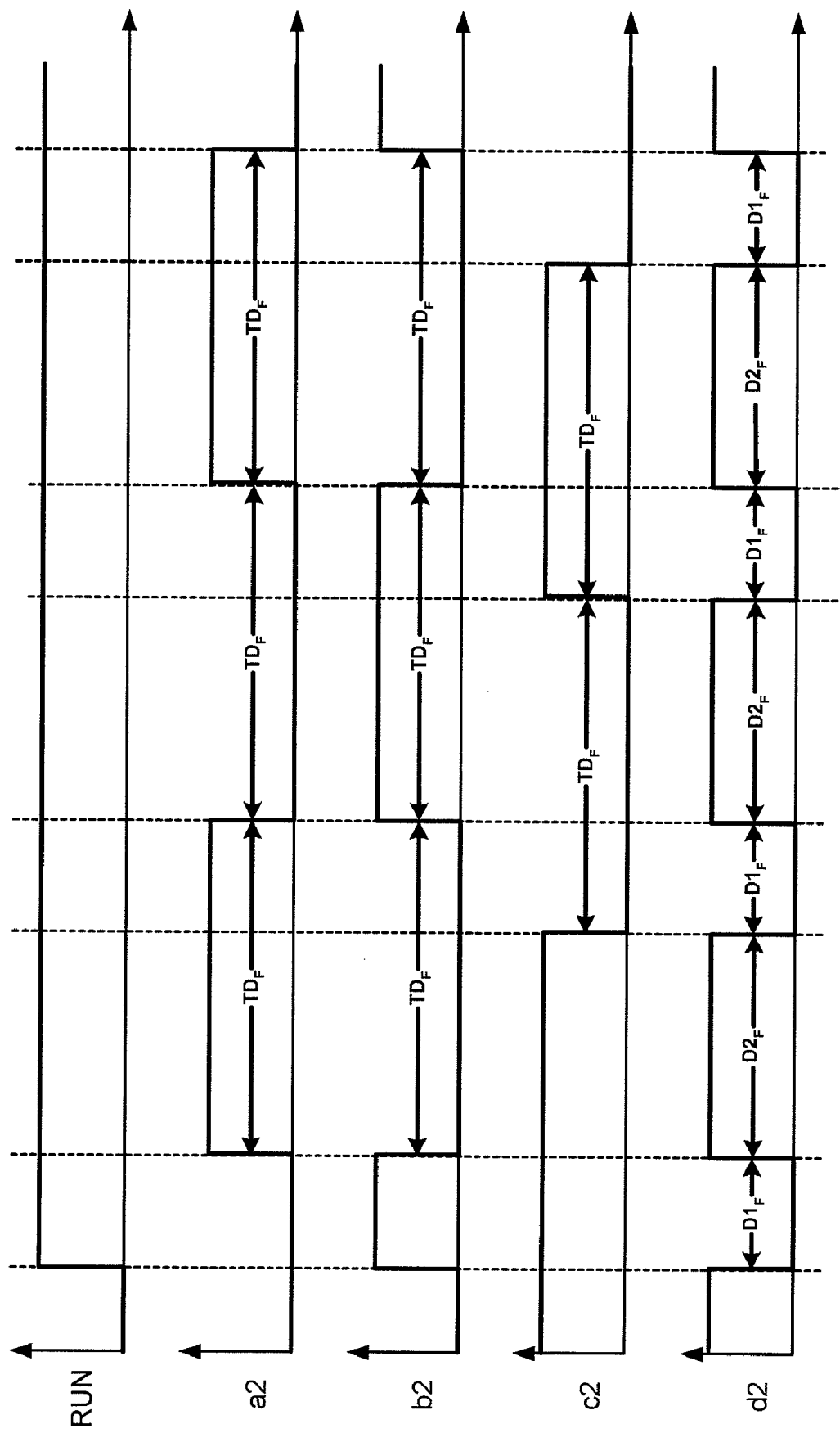
FIG. 4 is a timing diagram relating to the operation of the circuit of FIG. 3.

This will in turn cause the output signal of the first flip-flop 301 (i.e. signal "a2") to be set to LOW and the output signal of the second flip-flop 303 (i.e. signal "c2") to be set to HIGH, as is shown in FIG. 4. Because signal "a2" is set LOW and the RUN signal is set to LOW, the output of the XOR gate 302 will also be set to LOW. Moreover, because signal "c2" is set to HIGH, the multiplexer 307 will pass on its second input (signal "b2") and therefore the output of the multiplexer 307 will be set to LOW and signal "d2" will be set HIGH.

When the RUN signal is set to HIGH, the first input of the XOR gate 302 will be set to HIGH and therefore the output of the XOR gate 302 (signal "b2") will also be set to HIGH, causing the output of the multiplexer 307 (signal "d2") to go HIGH and the output of the inverter 310 to go LOW, thereby create a falling edge.

This falling edge will propagate through the first delay circuit 305 until it reaches the inverter 308, at which point it will be inverted into a rising edge and sent to the CLOCK input of the first flip-flop 301. Then, the signal on the D input of the first flip-flop 301 will be transferred from the input of the first flip-flop 301 through to the Q output of the first flip-flop 301, thereby causing signal "a2" to go from LOW to HIGH. Thus, at this point, both inputs of the XOR gate 302 will be set to HIGH and therefore the output of the XOR gate (signal "b2") will be switched to LOW. This will cause the second input of the multiplexer 307 to be switched to LOW and therefore the output of the inverter 310 (signal "d2") to be switched to HIGH. This state will then be maintained until the falling edge has finished propagating through the second delay circuit 104.

When the falling edge reaches the end of the second delay circuit 304, it will switched into a rising edge by inverter 309. This rising edge will be input into the CLOCK input of the second flip-flop 303 and the D input of the second flip-flop 303 will be sent to the Q output of the second flip-flop 303, thereby setting signal "c2" to LOW. This will switch the active input of the multiplexer 307 and will also set the input of the first flip-flop 301 to LOW. Because the active input of multiplexer 307 is switched from the second to the first input, and the first input (signal "a2") is set to HIGH, the output of the multiplexer 307 will be set to HIGH, thereby creating a falling edge at the output of inverter 310 which will propagate through both the first delay circuit 305 and the second delay circuit 304.

Again, this state will be maintained until the falling edge has propagated through the first delay circuit 305 and is converted into a rising edge by inverter 309, the rising edge then being input into the CLOCK input of the first flip-flop 301, thereby transferring the input of the first flip-flop 301 (signal "c2") to the output of the first flip-flop 301 (signal "a2"). Thus, signal "a2" will be set to LOW and signal "b2" will be set to HIGH. This will lead to signal "d2" being set to HIGH.

Once the falling edge of signal "d2" propagates through the second delay circuit 304, it is inverted by inverter 309 and the resulting rising edge reaches the CLOCK input of second flip-flop 303. At this point, the D input of second flip-flop 303 will be transferred to its Q output and, consequently, signal "c2" will be set HIGH, which in turn will set signal "d2" to LOW as well. This will again send a falling edge through the first delay circuit 305 until it reaches the inverter 308 which will send a rising edge to the CLOCK input of the first flip-flop 301 and transfers the D input of the first flip-flop 301 to its Q output. This will cause signal "b2" to be set to LOW and signal "a2" to be set to HIGH.

Then, when the falling edge of signal "d2" propagates through the second delay circuit 304 and reaches the inverter 309, which consequently sends a rising edge to the CLOCK input of the second flip-flop 303, it will set signal "c2" to LOW and signal "d2" to LOW.

The above cycle will be repeated until the RUN signal is set back to LOW. Accordingly, the oscillator circuit will continue to oscillate until it is switched off (i.e. by setting the RUN signal to LOW).

As can be seen from FIG. 4, the delay (D1F) related to the propagation of the falling edge through the first delay circuit 305 can be found by measuring the inverse pulse width of signal "d2" and the propagation delay (D2F) of the falling edge through the second delay circuit 104 can be found by measuring the pulse width of signal "d2". Also, the total propagation of the falling edge through both the first delay and the second delay can be found by dividing the period of any one of signals "a2", "b2" or "c2" by 2, once the circuit has reached a steady state.

In a third example of the present invention, a configurable arrangement can be implemented by replacing the invertors of the second embodiment with a combination of multiplexers 512, 513 and 514 and inverters 508, 509 and 510.

Figure 5:
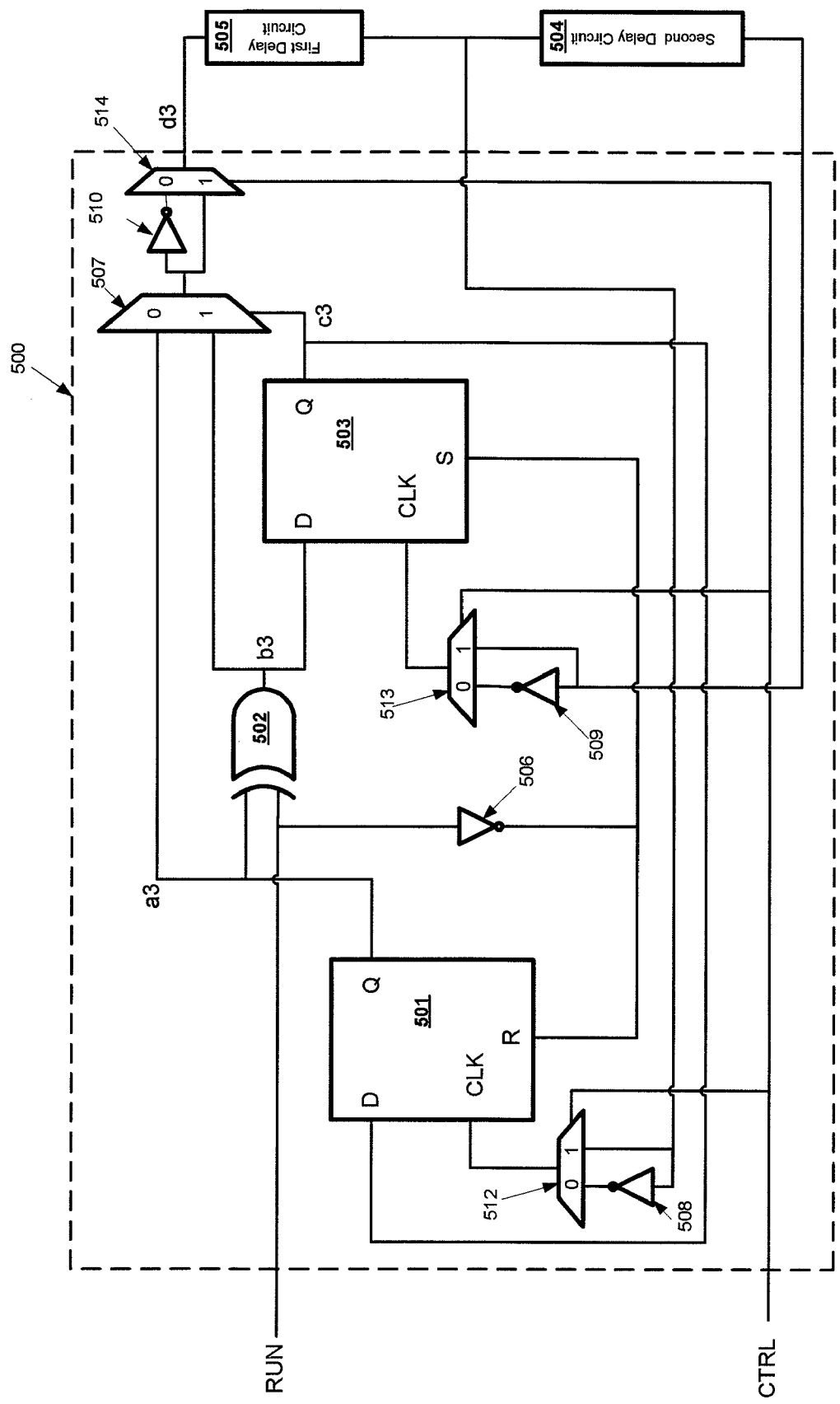
FIG. 5 is a schematic diagram of a circuit in accordance with a third example of the present invention.

With reference to FIG. 5, the third example of the present invention will now be described. The circuit 500 of the third example of the present invention comprises a first flip-flop 501 a second flip-flop 503, a two-input exclusive OR gate (XOR gate) 502, four inverters 506, 508, 509 and 510 and four two-input multiplexers 507, 512, 513 and 514. In this third example, the input signals of the circuit are the RUN signal and the CTRL signal.

The RUN signal is input into the first input of the XOR gate 502 as well as the input of the inverter 506. The output of inverter 506 is connected to both the RESET input of the first flip-flop 501 and the SET input of the second flip-flop 503. The 0 output of the first flip-flop 501 is connected to the second input of the XOR gate 502 as well as to the first input of the multiplexer 507. The output of the XOR gate 502 is connected to the second input of the multiplexer 507 as well as to the DELAY (D) input of the second flip-flop 503. The 0 output of the second flip-flop 503 is connected to the control input of the multiplexer 507 and also to the D input of the first flip-flop 501. Thus, the output of the second flip-flop 503 will control the selection of the first and second inputs of the multiplexer. In this example, when the output of the second flip-flop 503 is LOW, the first input of the multiplexer 507 will be selected and passed to the output. Conversely, when the output of the second flip-flop 503 is HIGH, the second input of the multiplexer 507 will be selected and passed to the output.

The output of the multiplexer 507 is connected to an inverter 510 and to the second input of multiplexer 514. The output of inverter 510 is connected to the first input of multiplexer 514. The output of multiplexer 514 is connected to the beginning of a first delay circuit 505. The end of the first delay circuit 505 is connected to the beginning of a second delay circuit 504, to the input of inverter 508 and to the second input of multiplexer 512. The output of inverter 508 is connected to the first input of multiplexer 508. The output of multiplexer 512 is connected to the CLOCK input of the first flip-flop 501. The end of the second delay circuit 504 is connected to the second input of multiplexer 513 and to the input of inverter 509. The output of inverter 509 is connected to the first input of multiplexer 513. The output of multiplexer 513 is connected to the CLOCK input of the second flip-flop 503.

Figure 6:
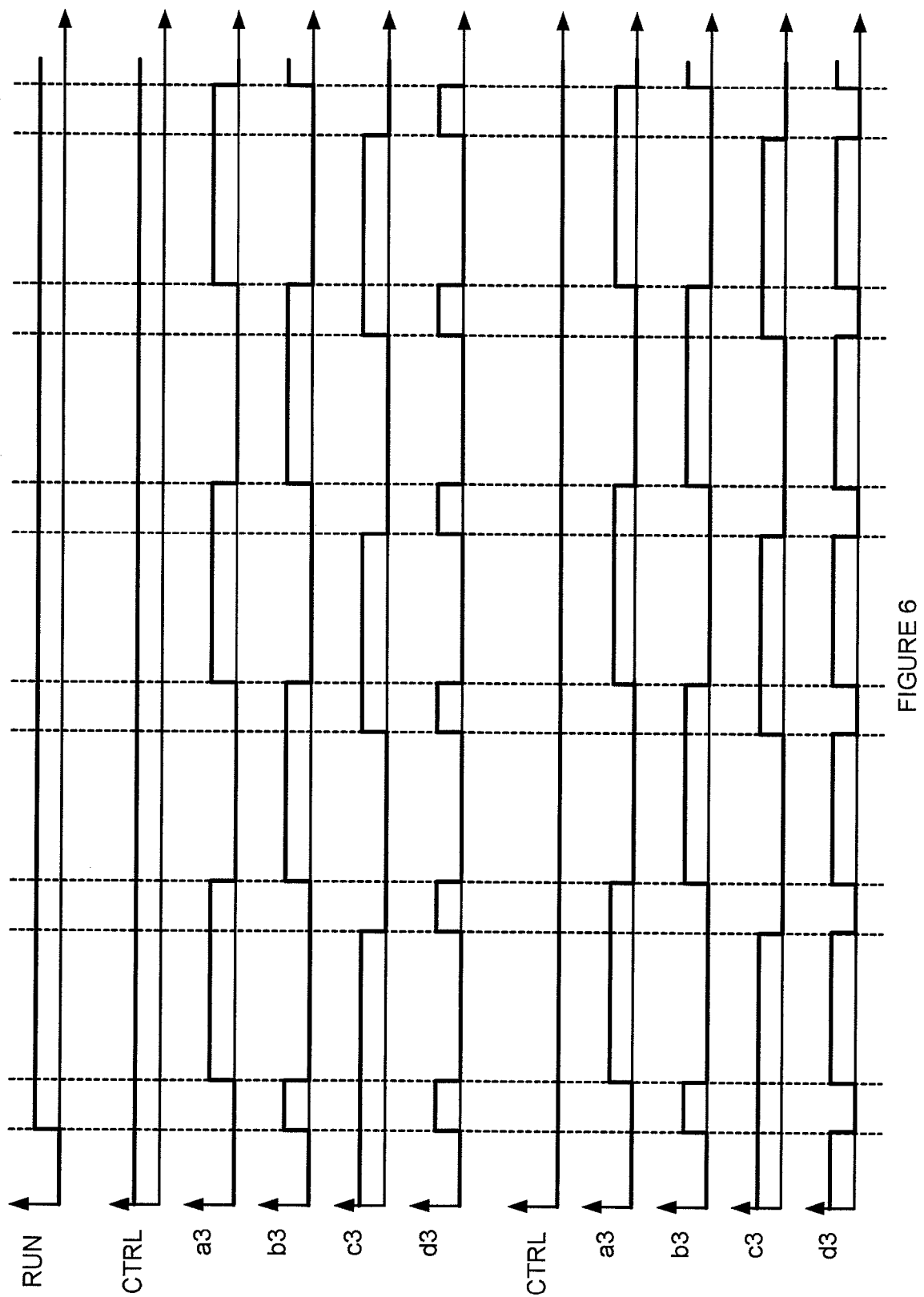
FIG. 6 is a timing diagram relating to the operation of the circuit of FIG. 5.

As can be seen from FIG. 5, when the control signal CTRL is set LOW, signal "d3" is the inverse of the output of multiplexer 507 and of inverters 508 and 509 both effect the CLOCK input of the first flip-flop 501 and the clock input of the second flip-flop 503. Accordingly, and with reference to FIG. 6, it can be seen that the third embodiment of the present invention can function as either the first example of the present invention (i.e. when CTRL is set HIGH) or the second embodiment of the present invention (i.e. when CTRL is set LOW). For the sake of brevity, the operation of the first and second examples of the present invention will not be repeated here.

In all of the above examples, the switching and propagation delays related to the flip-flops, the inverters, the multiplexers and the XOR gates of the circuit are negligible when compared to the propagation delays of the short and second delay circuits. Thus, in the timing diagrams of FIG. 2, FIG. 4 and FIG. 6, the switching and propagation delays of the circuits 100, 300 and 500 are not shown.

The flip-flops used in the above-described embodiments are positive edge-triggered flip-flops. However, as will be appreciated by a person skilled in the art, other flip-flops could be used to achieve similar functionality.

Although in most applications the switching and propagation time of the circuit will be negligible, the propagation delay of the second delay circuit 104 must be, at the very least, greater than the sum of the switching and propagation times of the first flip-flop 101, the XOR gate 102 and multiplexer 107. In the case of the second example of the invention, the propagation delay of the second delay circuit 304 must be, at the very least, greater than the sum of the switching and propagation times of the first flip-flop 301, the XOR gate 302, the multiplexer 307 and the inverter 310. Finally, in the case of the third example of the invention, the propagation delay of the second delay circuit 504 must be, at the very least, greater than the sum of the switching and propagation times of the first flip-flop 501, the XOR gate 502, the multiplexer 507, the inverter 510 and the multiplexer 514.

The invention claimed is:

1. A ring oscillator comprising: a first logic block having a first input connected to a specific point along a delay path, a first output and a second output; and a second logic block having a first input connected to the first output of the first logic block, a second input connected to the second output of the first logic block, a third input connected to an end of the delay path and a first output connected to a beginning of the delay path, wherein: the first logic block is arranged to, in use, alternately switch its first output and second output from logical HIGH to logical LOW, and vice versa, every time a rising edge is input into its first input; and the second logic block is arranged to, in use, alternately select its first input and its second input every time a rising edge is input into its third input, such that: a pulse width of a signal output from the first output of the second logic block is indicative of the time necessary for one of a rising edge or a falling edge to propagate from the beginning of the delay path to the specific point along the delay path and an inverse pulse width of the signal output from the first output of the second logic block is indicative of the time necessary for the one of the rising edge or the falling edge respectively to propagate from the specific point along the delay path to the end of the delay path.

2. The ring oscillator of claim 1, wherein:
the first logic block further comprises a second input for enabling the operation of the circuit and a third input; and
the second logic block further comprises a second output which is connected to the input of the third input of the first logic block and a fourth input.

3. The ring oscillator of claim 2, wherein the first logic block comprises:
a first logic block D-type flip-flop, the first input of the first logic block being connected to a clock input of the first logic block D-type flip-flop, the third input of the logic block being connected to a D input of the first logic block D-type flip-flop and a Q output of the first logic block D-type flip-flop being connected to the first output of the first logic block;
a two-input exclusive OR gate, the second input of the first logic block being connected to one input of the two-input exclusive OR gate, the Q output of the first logic block D-type flip-flop being connected to another input of the two-input exclusive OR gate and an output of the exclusive OR gate being connected to the second output of the first logic block; and
an inverter, the second input of the first logic block being connected to an input of the inverter and a Reset input of the first logic block D-type flip-flop being connected to an output of the inverter.

4. The ring oscillator of claim 3, wherein the second logic block further comprises:
a second logic block D-type flip-flop, a D input of the second logic block D-type flip-flop being connected to the second input of the second logic block, a clock input of the second logic block D-type flip-flop being connected to the third input of the second logic block, a SET input of the second logic block D-type flip-flop being connected to the output of the inverter; and
a two-input multiplexer, a first input of the multiplexer being connected to the first input of the second logic block, a second input of the multiplexer being connected to the second input of the second logic block and a control input of the multiplexer being connected to a Q output of the second logic block D-type flip-flop.

5. The ring oscillator of claim 1, the ring oscillator further comprising:

a first inverter located between the first output of the second logic block and the beginning of the delay path;

a second inverter located between the specific point along the delay path and the first input of the first logic block; and a third inverter located between the end of the delay path and the third input of the second logic block, such that:

an inverse pulse width of a signal output from the first inverter is indicative of the time necessary for the other one of the rising edge or the falling edge to propagate from the beginning of the delay path to the specific point along the delay path and a pulse width of the signal output from the first inverter is indicative of the time necessary for the other one of the rising edge or the falling edge to propagate from the specific point along the delay path to the end of the delay path.

6. The ring oscillator of claim 4, further comprising:

a first configurable bypasser that selectively bypasses the first inverter;

a second configurable bypasser that selectively bypasses the second inverter; and a third configurable bypasser that selectively bypasses the third inverter, wherein:

when the first, second and third configurable bypassers are configured to bypass the first, second and third inverters respectively, a pulse width of a signal input to the beginning of the delay path is indicative of the time necessary for one of a rising edge or a falling edge to propagate from the beginning of the delay path to the specific point along the delay path and an inverse pulse width of the signal input into the beginning of the delay path is indicative of the time necessary for the one of the rising edge or the falling edge to propagate from the specific point along the delay path to the end of the delay path; and when the first, second and third configurable bypassers are configured not to bypass the first, second and third inverter respectively, the inverse pulse width of the signal input into the beginning of the delay path is indicative of the time necessary for the other one of the rising edge or the falling edge to propagate from the beginning of the delay path to the specific point along the delay path and the pulse width of the signal input into the beginning of the delay path is indicative of the time necessary for the other one of the rising edge or the falling edge to propagate from the from the specific point along the delay path to the end of the delay path.

7. A method of measuring the propagation delay of a rising edge through a specific path in an integrated circuit using the ring oscillator of claim 1, the method comprising:

defining the delay path in an integrated circuit;

defining the specific point along the delay path such that the specific point is substantially in the centre of the delay path; and measuring a pulse width of a signal generated at the first output of the second logic block.

8. A method of measuring the propagation delay of a falling edge through a specific path in an integrated circuit using the ring oscillator of claim 5, the method comprising:

defining the delay path in an integrated circuit;

defining the specific point along the delay path such that the specific point is substantially in the centre of the delay path; and measuring an inverse of a pulse width of a signal generated at the first output of the second logic block.

9. A method of measuring the propagation delay of a rising edge through a specific path in an integrated circuit using the ring oscillator of claim 6, the method comprising:

defining the delay path in an integrated circuit;

defining the specific point along the delay path such that the specific point is substantially in the centre of the delay path;

configuring the first, second and third bypassers to bypass the first, second and third inverters respectively; and measuring a pulse width of a signal generated at the first output of the second logic block.

10. A method of measuring the propagation delay of a falling edge through a specific path in an integrated circuit using the ring oscillator of claim 6, the method comprising:

defining the delay path in an integrated circuit;

defining the specific point along the delay path such that the specific point is substantially in the centre of the delay path;

configuring the first, second and third bypassers to not bypass the first, second and third inverters respectively; and measuring an inverse of a pulse width of a signal generated at the first output of the second logic block.

* * * * *